US010852532B2

(12) United States Patent
Sun et al.

(10) Patent No.: US 10,852,532 B2
(45) Date of Patent: Dec. 1, 2020

(54) VCSEL ARRAY SCANNING DISPLAY

(71) Applicant: Microsoft Technology Licensing, LLC, Redmond, WA (US)

(72) Inventors: Ruipeng Sun, Pleasanton, CA (US); Chuan Pu, Foster City, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/198,248

(22) Filed: Nov. 21, 2018

(65) Prior Publication Data

US 2020/0159007 A1  May 21, 2020

(51) Int. Cl.
| G02B 26/10 | (2006.01) |
| G02B 26/08 | (2006.01) |
| G09G 3/02  | (2006.01) |
| G09G 3/20  | (2006.01) |
| H01S 5/42  | (2006.01) |

(52) U.S. Cl.
CPC ......... *G02B 26/10* (2013.01); *G02B 26/0858* (2013.01); *G09G 3/025* (2013.01); *G09G 3/2003* (2013.01); *G09G 2320/0666* (2013.01); *H01S 5/423* (2013.01)

(58) Field of Classification Search
None
See application file for complete search history.

(56) References Cited

U.S. PATENT DOCUMENTS

| 5,325,386 A | 6/1994 | Jewell et al. |
| 5,642,376 A | 6/1997 | Olbright et al. |
| 6,661,578 B2 | 12/2003 | Hedrick |
| 7,122,843 B2 | 10/2006 | Kahen et al. |
| 7,399,124 B2 | 7/2008 | Deng |
| 2003/0179978 A1* | 9/2003 | Iwasaki ............... G02B 6/0036 385/14 |
| 2007/0052660 A1 | 3/2007 | Montbach et al. |
| 2013/0242056 A1 | 9/2013 | Fleck et al. |
| 2014/0139467 A1 | 5/2014 | Ghosh et al. |

(Continued)

OTHER PUBLICATIONS

Francis, et al., "Monolithic 2D-VCSEL array with >2 W CW and >5 W pulsed output power", In Journal of Electronics Letters, vol. 34, Issue 22, Oct. 29, 1998, pp. 2132-2133.

(Continued)

*Primary Examiner* — Aneeta Yodichkas
(74) *Attorney, Agent, or Firm* — Alleman Hall Creasman & Tuttle LLP

(57) ABSTRACT

Examples are disclosed that relate to producing a viewable image using a plurality of individually-addressable vertical cavity surface emitting lasers (VCSELs) arranged into an array. In one example, a display system comprises a light source comprising a plurality of VCSELs arranged into an array comprising one or more first color rows of VCSELs configured to produce a first color, one or more second color rows of VCSELs configured to produce a second color, and one or more third color rows of VCSELs configured to produce a third color. Each VCSEL in a given row has a coordinate that is staggered relative to a coordinate of each of the VCSELs in one or more rows adjacent to the given row. The display system also comprises a scanning system to direct light from at least a portion of the plurality of VCSELs to produce a viewable image.

20 Claims, 9 Drawing Sheets

(56) References Cited

U.S. PATENT DOCUMENTS

2016/0072258 A1* 3/2016 Seurin ................ H01S 5/423
                                                           348/46
2019/0020858 A1* 1/2019 Pappas ................ G02B 26/10
2019/0317329 A1 10/2019 Taylor et al.

OTHER PUBLICATIONS

Iga, Kenichi, "Surface-emitting laser-its birth and generation of new optoelectronics field", In IEEE Journal of Selected Topics in Quantum Electronics, vol. 6, Issue 6, Nov. 2000, pp. 1201-1215.

Jackson, Abbey, "Intel's Vaunt AR Glasses ("Superlite")", Retrieved From: http://abbeyjackson.ca/portfolio, Retrieved Date: Sep. 17, 2018, 7 Pages.

Moench, Holger, "Vertical-cavity Surface-emitting Lasers: VCSEL arrays provide leading-edge illumination for 3D sensing", Retrieved From: https://www.laserfocusworld.com/articles/print/volume-53/issue-10/features/vertical-cavity-surface-emitting-lasers-vcsel-arrays-provide-leading-edge-illumination-for-3d-sensing.html, Oct. 12, 2017, 5 Pages.

Yu, et al., "Progress and prospects of GaN-based VCSEDL from near UV to green emission", In Journal of Progress in Quantum Electronics, vol. 57, Jan. 2018, 36 Pages.

Chua, et al., "Independently Addressable VCSEL Arrays On 3-μm Pitch", In Proceedings of The IEEE Photonics Technology Letters, vol. 10, Issue No. 7, Jul. 1998, pp. 917-919.

"International Search Report and Written Opinion Issued in PCT Application No. PCT/US19/061344", dated Mar. 13, 2020, 11 Pages.

* cited by examiner

VCSEL ARRAY SCANNING DISPLAY

BACKGROUND

Some beam-scanning displays utilize electromechanical systems to scan a plurality of light sources to form an image. Such displays may be made compact and lightweight, making them desirable for augmented or virtual reality applications. However, achieving desirable brightness and resolution from compact light sources may be challenging.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to display systems, devices, and methods for producing a viewable image using a plurality of individually-addressable vertical cavity surface emitting lasers (VCSELs) arranged into an array. In one example, a display system comprises a light source comprising a plurality of individually-addressable VCSELs arranged into an array. The array comprises one or more first color rows of VCSELs extending along a first axis and configured to produce a first color, one or more second color rows of VCSELs parallel to the one or more first color rows and spatially separated from the one or more first color rows along a second axis perpendicular to the first axis, the VCSELs in the one or more second color rows configured to produce a second color different from the first color, and one or more third color rows of VCSELs parallel to the one or more first color rows and spatially separated from the one or more first color rows and the one or more second color rows along the second axis, the VCSELs in the one or more third color rows configured to produce a third color different from the first color and the second color. Each VCSEL in a given row has a coordinate on the first axis that is staggered relative to a coordinate on the first axis of each of the VCSELs in one or more rows adjacent to the given row. The display system also comprises a scanning system comprising at least one mirror moveable about at least one axis to direct light from at least a portion of the plurality of VCSELs in one or more directions to produce a viewable image.

DETAILED DESCRIPTION

Some beam-scanning displays utilize electromechanical scanning systems to scan a plurality of light sources to form an image. Such devices may feature light sources configured to emit light in a predetermined pattern. The pattern may be scanned by one or more moveable mirrors configured to direct at least a portion of the light in different directions to form an image. Color images may be produced by configuring the plurality of light sources to produce one or more primary colors (such as red, green, or blue). Using the scanning systems, these light sources may be combined to produce color images.

Beam-scanning displays may be made compact and lightweight using miniaturized arrays of light sources and micro-electromechanical (MEMS) systems to scan the light sources. Such compact, lightweight displays are desirable for mobile and wearable applications, such as in augmented reality (AR), virtual reality (VR), or mixed reality (MR) devices. For example, beam-scanning displays may be integrated into head-mounted display (HMD) devices.

However, it can prove challenging to achieve desirable optical parameters from compact light sources. For example, a beam-scanning display may have a minimum threshold brightness output and/or a desired level of collimation, which may be difficult to achieve from μm-scale light sources.

Vertical cavity surface emitting lasers (VCSELs) may be useful light sources for beam scanning displays. VCSELs can deliver higher brightness and more collimated light than other light sources, such as micro-LEDs. Used as the light source in a beam-scanning display, a single VCSEL array may also serve as a color generator and a grayscale modulator. For example, grayscales in display brightness may be generated by modulating the laser emission intensity. In this manner, VCSEL arrays may avoid the use of other bulky components required by other types of displays (e.g. a backlight for an LCD display).

However, VCSELs configured to produce different colors may comprise different materials and/or may be formed using different manufacturing processes. Accordingly, it may be difficult to produce a VCSEL array that is configured to produce different colors on a single substrate. Additionally, some VCSEL arrays are smaller in number than those suitable for a high-resolution beam scanning display. In some examples, the VCSELs in an array may have pitches that are too large to produce the brightness output needed for particular displays. Such VCSELs are also typically formed on III-V semiconductor substrates or silicon substrates lacking individual driving circuits. This may make precise control of individual VCSELs difficult.

Figure 1:
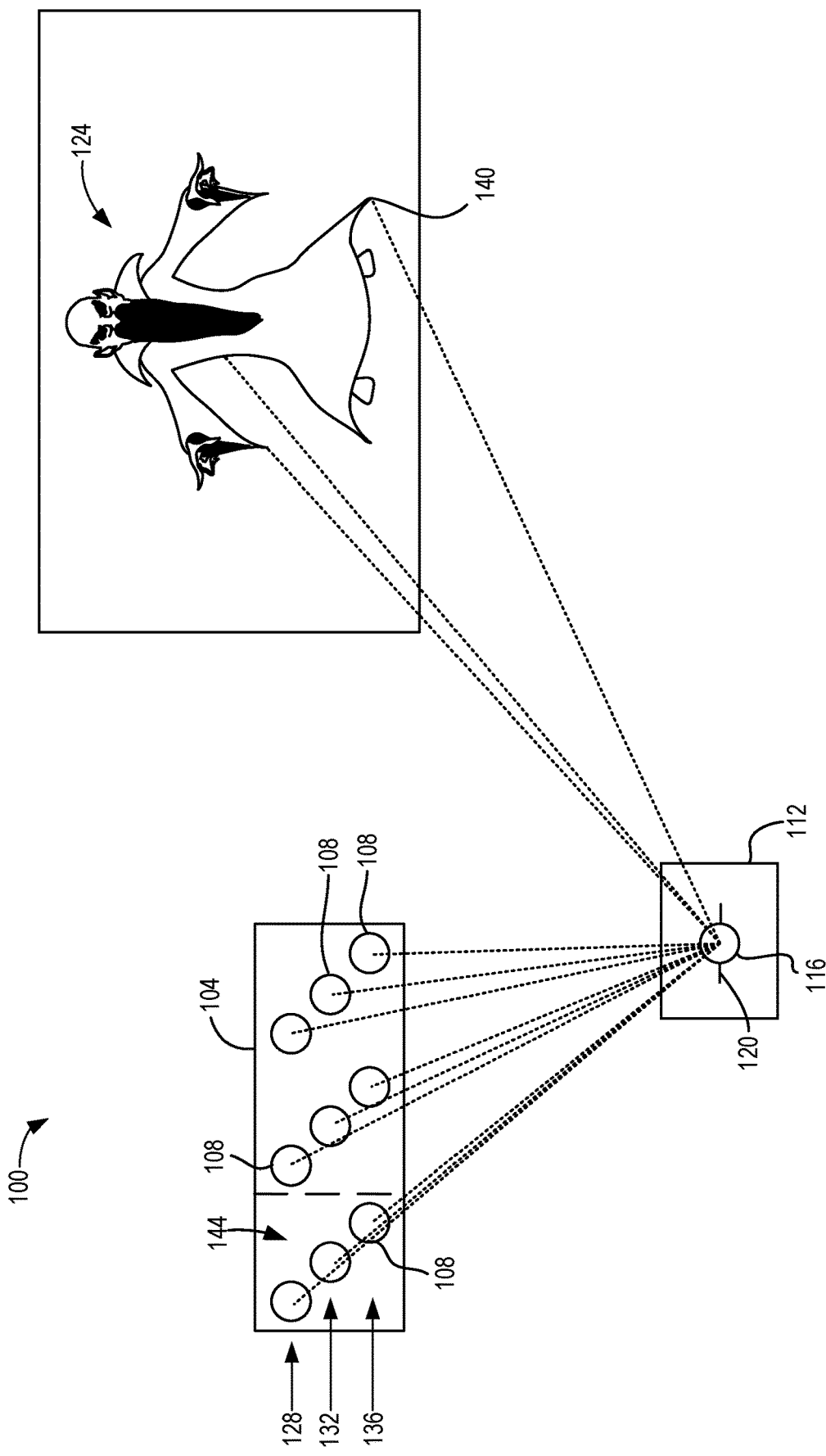
FIG. 1 shows an example of a display system according to examples of the present disclosure.

Accordingly, examples are disclosed that relate to producing a viewable image from a light source comprising a plurality of individually-addressable VCSELs arranged into an array. With reference now to FIG. 1, one example of a display system 100 is illustrated including a VCSEL array 104 comprising a plurality of individually-addressable VCSELs 108. The display system 100 also includes a scanning system 112 comprising at least one mirror 116. As described in more detail below regarding FIG. 2, the mirror 116 is moveable about at least one axis 120 to direct light from at least a portion of the plurality of VCSELs 108 in one or more directions to produce a viewable image 124.

As described in more detail below, the VCSEL array 104 may comprise a plurality of VCSELs 108 configured to produce one or more colors, such as red VCSELs in a first color row 128, green VCSELs in a second color row 132, and blue VCSELs in a third color row 136. The scanning system 112 may combine light from the red VCSELs, green VCSELs, and blue VCSELs to produce a pixel 140 in a viewable image 124. In this manner, the pixel 140 may have a given color within a range of a color space, such as sRGB, available by combining light produced by the VCSELs 108. Accordingly, in some such examples, a group 144 comprising one red VCSEL, one green VCSEL, and one blue VCSEL may correspond to one color pixel 140 in the viewable image 124.

Figure 2:
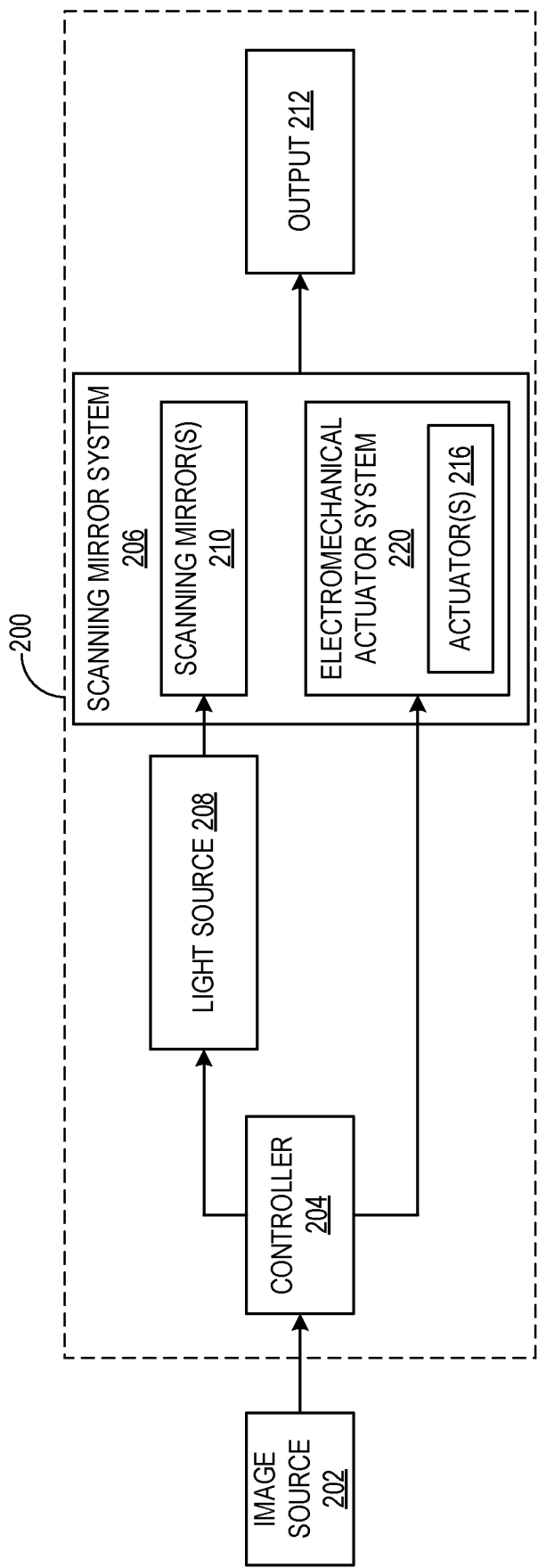
FIG. 2 schematically shows an example display device that includes a scanning mirror system according to examples of the present disclosure.

With reference now to FIG. 2, a schematic example of a display device 200 in communication with an image source 202 is illustrated. Display device 200 includes a controller 204 operatively coupled to a scanning mirror system 206 and to a light source 208. The controller 204 is configured to control the scanning mirror system 206 and the light source 208 to emit light based on image data received from image source 202. Light source 208 may include any suitable light-emitting elements, such as the VCSEL array 104 of FIG. 1.

The light source 208 may be configured to produce light in any suitable wavelength ranges, such as red, green, and blue wavelength ranges or cyan, magenta, and yellow wavelength ranges, that enable the production of color images. In other examples, light source 208 may output substantially monochromatic light.

Scanning mirror system 206 comprises one or more scanning mirrors 210 controllable to vary an angle at which light from the light source 208 is reflected to thereby scan an image. As mentioned above, scanning mirror system 206 may include a single mirror configured to scan light in horizontal and/or vertical directions, or two or more separate mirrors. For example, separate mirrors may be configured to scan in the horizontal and vertical directions. In other examples, scanning mirror system 206 may scan light in any other suitable manner via any suitable number of mirrors.

The scanning mirror system 206 comprises an electromechanical actuator system 220 comprising one or more actuators 216 controllable to rotate the scanning mirror(s) 210. Light reflected by the scanning mirror(s) 210 is directed toward an output 212 for display of a scanned image. As described in more detail below, output 212 may take any suitable form, such as projection optics, waveguide optics, etc. In different examples, display device 200 may be configured as a fully-immersive, virtual reality head-mounted display (HMD) device, a mixed reality HMD device that provides a view of a real-world environment, or any other suitable display device, such as a head-up display, mobile device screen, monitor, television, etc.

Figure 3:
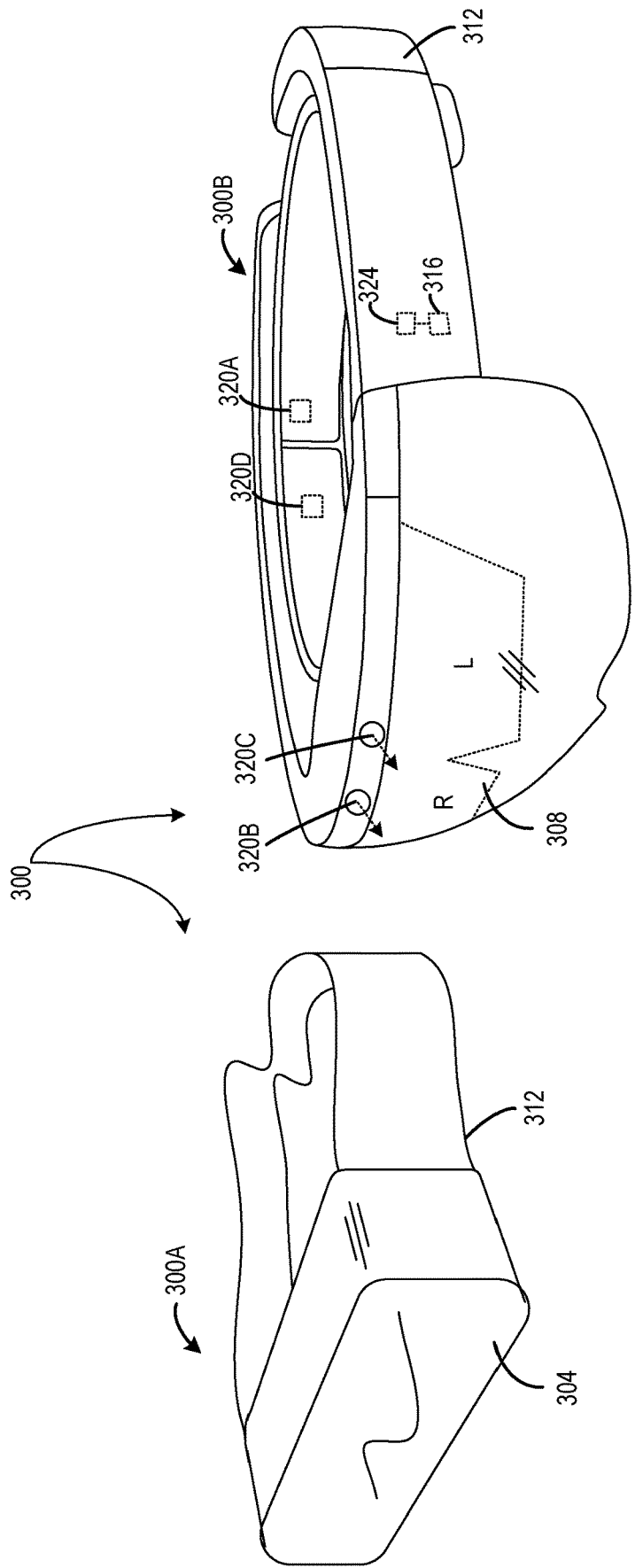
FIG. 3 shows two examples of head-mounted display devices according to examples of the present disclosure.

For example, FIG. 3 illustrates two examples of HMD devices 300. One example of an HMD device 300 is a virtual reality HMD device 300A that includes an opaque, non-see-through display 304. Another example of an HMD device 300 is an augmented reality HMD device 300B that comprises an at least partially transparent display 308. It will be appreciated that the following descriptions of sensors and systems may apply to both the augmented reality HMD device 300A and the virtual reality HMD device 300B.

In the example of FIG. 3, each of the example HMD devices 300A and 300B has a construction that includes a frame 312 that wraps around the head of the user to position a display close to the user's eyes. The frame of virtual reality HMD device 300A may include a rigid portion and an elastic portion, whereas the frame 312 of augmented reality HMD device 300B may be substantially rigid around its circumference. The frame 312 may support additional components such as, for example, a processor 316 and input devices 320A, 320B and 320C.

The processor 316 includes logic and associated computer memory 324 configured to provide visual content to the display, to receive sensory signals from input devices 320A, 320B and 320C, and to enact various control processes described herein. For example, the memory 324 may store one or more instructions executable by the processor 316 to activate at least a portion of the VCSELs 108 in the example of FIG. 1, and to control the scanning system 112 to direct light emitted by the portion of the VCSELs to produce the viewable image 124. Additional details regarding the processor 316 and memory 324 are described in more detail below with respect to FIG. 9.

With reference again to FIG. 3, various suitable display technologies and configurations may be used to display images via the displays of the HMD devices 300A and 300B. For example, in virtual reality HMD device 300A, the display 304 may be an opaque display that utilizes a VCSEL array as described herein. In augmented reality HMD device 300B, the display 308 may be an at least partially transparent display that is configured to enable a wearer of the augmented reality HMD device 300B to view physical, real-world objects in the physical environment through one or more partially transparent pixels displaying virtual object representations. For example, the augmented reality HMD device 300B may include a light modulator on an edge of the display 308. In this example, the display 308 may serve as a light guide for delivering light from the light modulator to the eyes of a wearer. For example, the display 308 may comprise a waveguide configured to receive light from a VCSEL array described herein and a scanning system, and to output the viewable image. Additional details regarding a waveguide display are described in more detail below regarding FIG. 4.

The display 308 may include both a left L and right R display in a stereoscopic display configuration. The left L and right R displays each display a view of an augmented reality scene from the perspective of the user's corresponding eye. By viewing the augmented reality scene through the left L and right R displays, the user may perceive virtual objects as being located at particular depths in the real world.

The input devices 320A, 320B and 320C may include various sensors and related systems to provide information to the processor 316. Such sensors may include an inertial measurement unit (IMU) 320A, one or more image sensors 320B, and one or more ambient light sensors 320C. The one or more outward facing image sensors 320B may be configured to capture and/or measure physical environment attributes of the physical environment in which the augmented reality HMD device 320B is located. In one example, the one or more image sensors 320B may include a visible-light camera configured to collect a visible-light image of a physical space.

In one example of the augmented reality HMD device 320B that includes a display 308 having a transparent display type, the position and/or orientation of the augmented reality HMD device 300B relative to the physical environment may be assessed so that augmented-reality images may be accurately displayed in desired real-world locations with desired orientations. In both augmented reality HMD device 300B and virtual reality HMD device 300A, the IMU 320A may be configured to provide position and/or orientation data to the processor 316. The orientation derived from the sensor signals of the IMU may be used to display one or more holographic images with a realistic and stable position and orientation.

Figure 4:
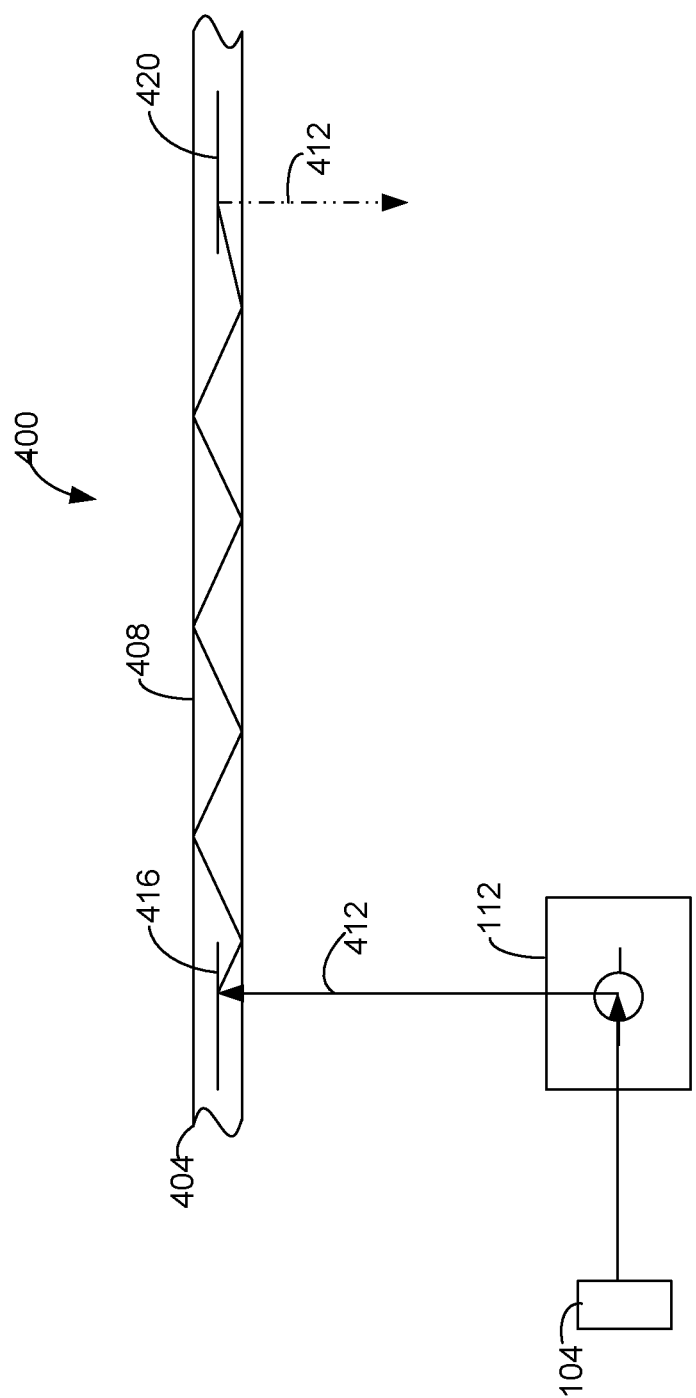
FIG. 4 shows an example embodiment of a waveguide and schematically illustrates light propagating from an input light coupling to an output light coupling of the waveguide.

With reference now to FIG. 4 and as described above, in some examples of a display system a scanning mirror system may be configured to output a viewable image to a waveguide. FIG. 4 illustrates a schematic representation of an example display system 400 comprising a waveguide 404. The waveguide 404 may be composed of glass, such that light is reflected by total internal reflection at an air-glass interface 408.

As illustrated, the waveguide 404 may receive input light 412 from the VCSEL array 104 and scanning system 112 at a holographic light input grating 416. The holographic light input grating 416 may include two or more angularly multiplexed holographic recordings arranged to achieve a sufficient angular bandwidth to couple all desired angles of light from the image source 414 into waveguide 404.

The light 412 may be output from the waveguide 404 via a holographic light output grating 420. Like the multiplexed holographic light input grating 416, the multiplexed holographic light output grating 420 may include two or more angularly multiplexed holographic recordings arranged to achieve a sufficient angular bandwidth to provide a desired field of view for a display device utilizing the waveguide 404.

While depicted schematically as located in a single layer of the waveguide 404, the multiplexed holographic grating elements 416 and 420 may occupy multiple layers. For example, in display devices that utilize light sources producing three different colors, the waveguide 404 may include at least three layers of light input and output gratings, each layer corresponding to a different wavelength of light produced by the light sources.

As described above, the light sources may comprise a plurality of VCSELs. In one example, red, green and blue VCSELs may be positioned in a line and arranged in a repeating pattern of red, green, blue, red, green, blue, etc. In some examples and to generate the brightness required for particular display systems, the VCSEL-to-VCSEL pitch between adjacent VCSELs may need to be as small as 2 μm. Given a VCSEL-to-VCSEL pitch of 2 μm, the distance between VCSELs of the same color (e.g. the pitch between a first red VCSEL and a second red VCSEL) would be three times the VCSEL-to-VCSEL pitch, or 6 μm. However, it can prove quite challenging to fabricate such a high density of VCSELs, especially in patterns of multiple colors formed on a single substrate.

In other examples, a two-dimensional, time-multiplexed RGB VCSEL array may be utilized by providing a first substrate comprising one or more horizontal lines of red VCSELs, a second substrate comprising one or more horizontal lines of green VCSELs and a third substrate comprising one or more horizontal lines of blue VCSELs. The substrates may be stacked or combined in any suitable manner. For example, individual lines of each color may be stacked to form a two-dimensional array. By illuminating the VCSELs in synchronization with the scanning system, color images may be produced as described above. However and as with the example described above, the pitch between adjacent VCSELs of the same color may need to be as small as 2 μm, thereby also creating the fabrication challenges discussed above.

Figure 5:
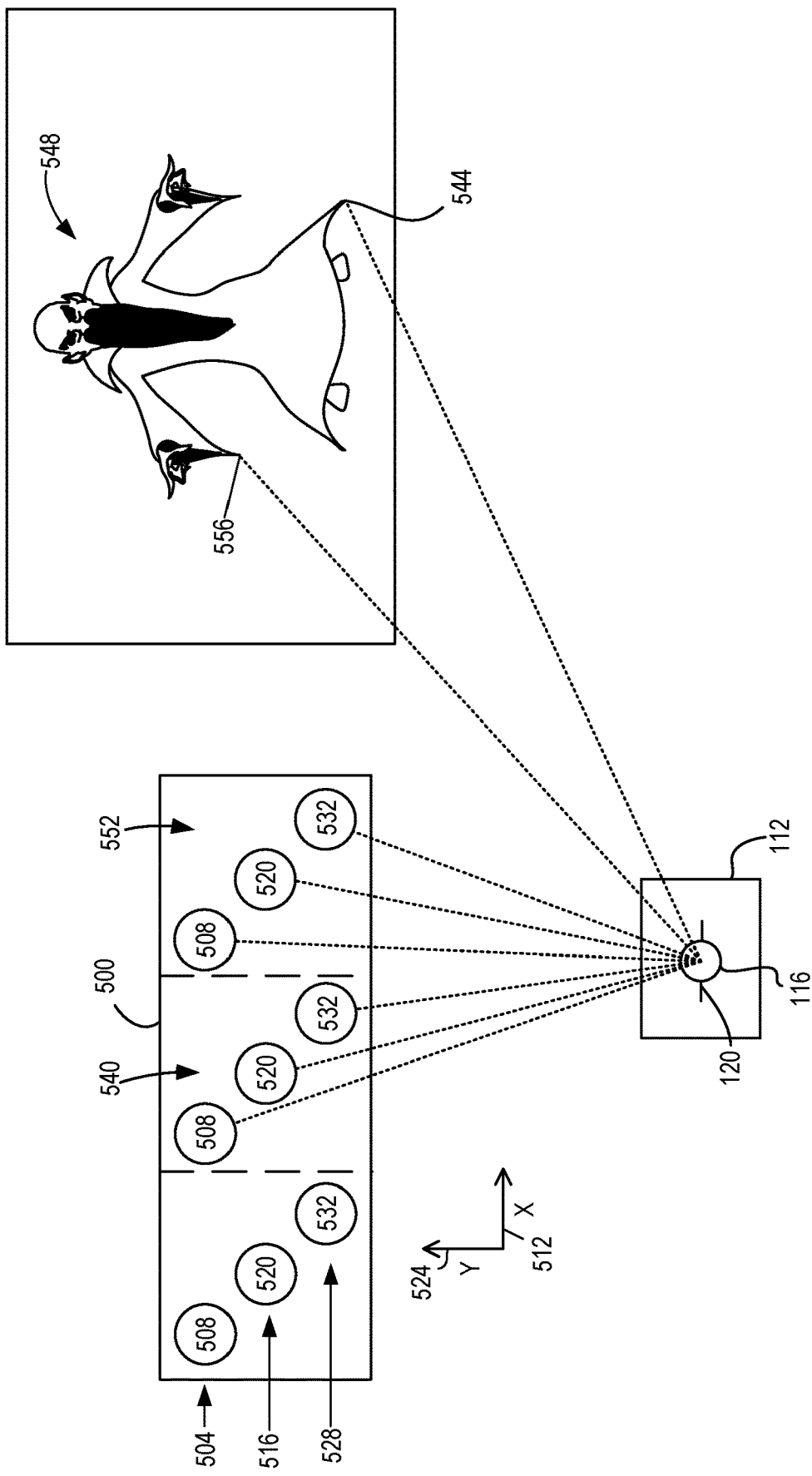
FIG. 5 schematically illustrates a VCSEL array according to one example of the present disclosure.

Accordingly, and in one potential advantage of the present disclosure, staggered rows of VCSELs in an offset two-dimensional array may be utilized with a scanning display system to generate sufficient brightness and desired collimation, while also improving manufacturability by enabling a larger VCSEL-to-VCSEL pitch. With reference now to FIG. 5, one example of a portion of a VCSEL array 500 according to aspects of the present disclosure is illustrated. As described in more detail below, in the VCSEL array 500 each VCSEL in a given row has a coordinate on a first axis that is staggered relative to a coordinate on the first axis of each of the VCSELs in the row(s) adjacent to the given row. It will be appreciated that the VCSEL array 500 shown in FIG. 5 is provided to facilitate ease of description. In different examples, the VCSEL array 500 may have any suitable size and include any suitable number of rows and VCSELs.

The VCSEL array 500 comprises a first color row 504 of VCSELs 508 extending horizontally along a first axis 512 (illustrated in this example as the x-axis). The VCSELs 508 are configured to produce a first color. For example, the VCSELs 508 may be configured to emit red light. The VCSEL array 500 also comprises a second color row 516 of VCSELs 520. The VCSELs 520 in the second color row 516 are configured to produce a second color different from the first color. For example, the VCSELs 520 may be configured to emit green light.

The second color row 516 is parallel to the first color row 504 and is spatially separated from the first color row 504 by a distance along a second axis 524 (in this example the y-axis) perpendicular to the x-axis 512. For example, VCSELs with a diameter of 2 μm may have a coordinate on the y-axis 524 that is offset by at least 2 μm from the coordinate of a VCSEL in an adjacent row. In different examples, the coordinate of a VCSEL may correspond to the center of the VCSEL, or to another designated location on the VCSEL. In this manner, the VCSELs may be arranged in parallel rows that do not overlap.

Additionally, the VCSEL array 500 comprises a third color row 528 of VCSELs 532. The third color row 528 is parallel to the first color row 504 and the second color row 516. Like the second color row 516, the third color row 528 is spatially separated from the first color row 504 and the second color row 516 along the y-axis 524. Further, the VCSELs 532 in the third color row 528 are configured to produce a third color different from the first color and the second color. For example, the VCSELs 532 may be configured to emit blue light.

In this manner, the VCSELs 508, 520, and 532 may comprise a full complement of red, green, and blue VCSELs that are suitable for generating color images. It will also be appreciated that the VCSELs 508, 520, and 532 may be configured to produce any other suitable colors, such as cyan, magenta, and yellow. It will also be appreciated that the VCSELs 508, 520, and 532 may be configured to produce a given color by any suitable method or configuration. For example, as described above, the VCSELs 508, 520, and 532 may be configured to emit light having a wavelength corresponding to the given color. The VCSELs may additionally or alternatively emit light through a phosphor material to produce the given color, emit light through a filter to produce the given color, or produce the given color via other suitable means.

With reference again to the arrangement of the portion of the VCSEL array 500 illustrated in FIG. 5, the VCSELs are staggered along the x-axis 512 such that each VCSEL in a given row has a coordinate on the x-axis 512 that is offset relative to each of the VCSELs in one or more rows adjacent to the given row. In the example of FIG. 5, the illustrated VCSELs are offset such that no two VCSELs share the same coordinate on the x-axis 512. In other examples, additional VCSEL arrays having the same staggered configuration may be provided on any side of the array 500.

In the example of FIG. 5, the VCSELs 508 in the first color row 504 are offset relative to the VCSELs 520 in the adjacent second color row 516, and the VCSELs 520 in the second color row 516 are offset relative to both the VCSELs 508 in the adjacent first color row 504 and to the VCSELs 532 in the adjacent third color row 528. For example, VCSELs with a diameter of 2 µm may have a coordinate on the x-axis 512 that is offset by at least 2 µm from the coordinate on the x-axis of a VCSEL in the one or more adjacent rows.

In this manner, light emitted from the VCSELs may be optically transformed using a scanning system 112 or other suitable optical elements of a display system. For example, one or more mirrors of the scanning system 112 may be moveable about the x-axis 512 to scan at least a portion of the VCSELs in a direction parallel to the y-axis 524. In this manner, light produced by the VCSEL array 500 may be directed by the scanning system 112 such that the array 500 appears or functions substantially the same as if all of the VCSELs in the array have the same coordinate on the y-axis 524. In other words, the scanning system 112 may control movements of mirror 116 via temporal multiplexing to direct light from the various VCSELs 508, 520 and 523 to have the same y-axis position.

For example and as illustrated in FIG. 5, scanning system 112 may combine light from a group of VCSELs 540 comprising one VCSEL 508 from the first color row 504, one VCSEL 520 from the second color row 516, and one VCSEL 532 from the third color row 528 to produce a pixel 544 in viewable image 548. In this manner, the pixel 544 may have a given color within a color space available by combining light produced by the VCSELs 508, 520, and 532 within the group 540. The scanning system 112 may also combine light from another, different group of VCSELs 552 comprising one VCSEL 508, one VCSEL 520, and one VCSEL 532 to produce another, different pixel 556 in the image 548, which may have a different color than the pixel 544.

Accordingly, and in one potential advantage of the present disclosure, utilizing a VCSEL array having the configuration of array 500 may enable the VCSEL-to-VCSEL pitch along the x-axis between adjacent VCSELs on a single row to be significantly increased, while still providing sufficient brightness via temporal multiplexing of the scanning system. In some examples, the VCSEL-to-VCSEL pitch along the x-axis between the VCSELs 508 in the first color row 504 may be between approximately 6-30 µm. Similarly, the VCSEL-to-VCSEL pitch between the VCSELs 520 in the second color row 516 and the VCSELs 532 in the third color row 528 also may be between approximately 6-30 µm.

In one example, the VCSEL-to-VCSEL pitch between the VCSELs in each of the three rows may be approximately 6 µm. In this example, the approximately 6 µm spacing between VCSELs may improve the manufacturability of such an array, while also providing a brightness equivalent to the brightness of a single, linear row of such VCSELs having a 2 µm VCSEL-to-VCSEL pitch. In this manner and when used with a scanning display system as described above, the array 500 advantageously enables a VCSEL-to-VCSEL pitch that is three times larger than the pitch of a single, linear row of such VCSELs.

In this manner, the VCSELs in the array 500 may function substantially the same as an apparent linear array with all of the VCSELs arranged in the same row and having a much smaller pitch. As noted above, the ability to space each VCSEL farther apart within each row may make the array 500 less challenging and less costly to manufacture.

Figure 6:
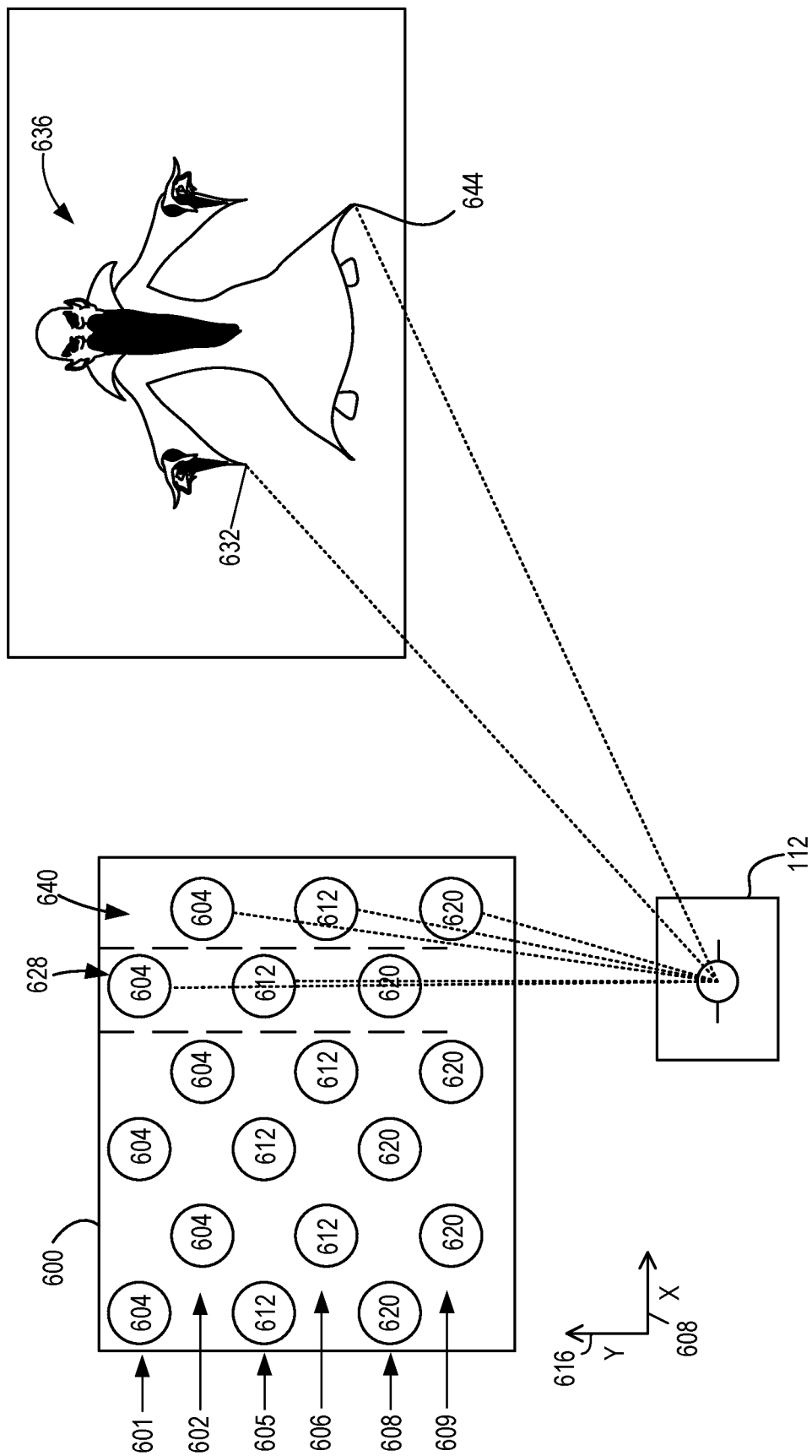
FIG. 6 schematically illustrates a VCSEL array according to another example of the present disclosure.

In other examples, VCSEL arrays may be arranged with two or more adjacent rows of VCSELs configured to produce each color. For example, FIG. 6 illustrates a portion of an example VCSEL array 600 comprising two rows of VCSELs for each of three colors. In this example, two color rows 601 and 602 of VCSELs 604 extend along first axis 608 (in this example, the x-axis) and are parallel to each other. Each of the VCSELs 604 is configured to produce a first color (e.g. red). As shown in FIG. 6, the first color row 601 is offset from the second color row 602 along the second axis 616 (y-axis). Additionally, each of the VCSELs 604 is staggered (offset) along the x-axis with respect to one another.

The VCSEL array 600 also comprises two color rows 605 and 606 of VCSELs 612 configured to produce a second color (e.g. green). The two color rows 605 and 606 of VCSELs 612 are parallel to the two color rows 601 and 602 of VCSELs 604. Further, the VCSELs 612 are spatially separated from the VCSELs 604 by a distance along the y-axis 616 perpendicular to the x-axis 608. In this example, each of the color rows 601, 602, 605, and 606 are parallel to one another and do not overlap.

The VCSEL array 600 also comprises another two color rows 608 and 609 of VCSELs 620 configured to produce a third color (e.g. blue). The two color rows 608 and 609 of VCSELs 620 are parallel to the other four color rows 601, 602, 605 and 606. Further, the VCSELs 620 are spatially separated from the VCSELs 604 and 612 along the y-axis. Additionally, and like the configuration illustrated in FIG. 5, each of the VCSELs 604, 612 and 620 are staggered along the x-axis such that each VCSEL in a given row has a coordinate on the x-axis that is offset relative to each of the VCSELs in the one or more rows adjacent to the given row. Additionally and in the example illustrated in FIG. 6, each VCSEL within each vertical three-VCSEL group, such as group 628 and group 640, has the same coordinate on the x-axis 608, and each such group is spaced from one another along the x-axis. In other examples, additional VCSEL arrays having the same staggered configuration may be provided on any side of the array 600.

In this manner, the scanning system 112 or other optical elements may optically transform the VCSEL array 600 to appear or function substantially the same as if all of the VCSELs 604 are in one first color row (e.g., all VCSELs 604 have the same coordinate on the y-axis), all of the VCSELs 612 are in one second color row, and all of the VCSELs 620 are in one third color row. For example, the scanning system 112 may control movements of mirror 116 via temporal multiplexing to direct light from various VCSELs 604, 612 and 620 to have the same y-axis position. For example, as illustrated in FIG. 6, scanning system 112 may combine light from a group 628 comprising one VCSEL 604, one VCSEL 612, and one VCSEL 620 to produce a pixel 632 in viewable image 636.

In this manner, the pixel 632 may have a given color within a color space available by combining light produced by the VCSELs 604, 612, and 620 within the group 628. The scanning system 112 may also combine light from another, different group 640 to produce another, different pixel 644 in the image 636, which may have a different color than the pixel 644.

Accordingly, in one potential advantage of the present disclosure, and like the array 500 described above, utilizing a VCSEL array having the configuration of array 600 may enable the VCSEL-to-VCSEL pitch along the x-axis between adjacent VCSELs on a single row to be increased, while still providing sufficient brightness via temporal multiplexing of the scanning system. For example, the VCSEL-to-VCSEL pitch along the x-axis between the VCSELs 604 in the first color row 601 may be between approximately 4-20 μm. The other color rows also may utilize the same VCSEL-to-VCSEL pitch. As described in more detail below, and in one potential advantage of the present disclosure, in different examples the VCSEL array 600 may function as if the VCSELs are arranged in a more densely-packed array having a narrower actual pitch, such as between approximately 2-10 μm, while the VCSELs in the array 600 may have an actual pitch that is larger, such as approximately 4-20 μm within each row.

In one example, the VCSEL-to-VCSEL pitch between the VCSELs in each of the color rows may be approximately 4 μm. In this example, the approximately 4 μm spacing between VCSELs may improve the manufacturability of such an array as compared to arrays with smaller pitches between VCSELs, while also providing a brightness equivalent to the brightness of such more densely-packed arrays. For example, where array 600 utilizes a VCSEL-to-VCSEL pitch in each of the color rows of approximately 4 μm, this array may provide a brightness equivalent to the brightness of three linear rows of VCSELs having a 2 μm VCSEL-to-VCSEL pitch, where each row corresponds to a different color. In this manner and when used with a scanning display system as described above, the array 600 advantageously enables a VCSEL-to-VCSEL pitch that is twice as large as the pitch of such an array using three vertically-stacked linear rows of VCSELs.

Figure 7:
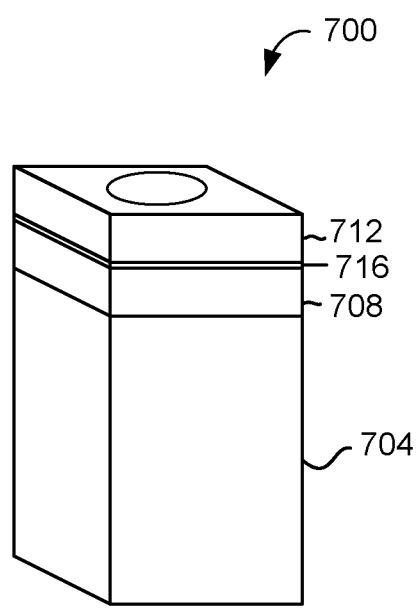
FIG. 7 illustrates an example of a VCSEL on a silicon substrate according to examples of the present disclosure.

With reference now to FIG. 7, various methods may be used to build arrays of color VCSELs on silicon substrates. Some examples of suitable methods may include monolithic wafer bonding and processing or a hybrid method with multiple monolithic VCSEL-on-Silicon chips. For example, the VCSELs may be fabricated, cut out and placed on one or more substrates to form an array, or the VCSELs may be fabricated directly on the one or more substrates comprising the array.

FIG. 7 illustrates one example of a VCSEL 700 formed on a silicon substrate 704. In this example, the VCSEL 700 includes a first Bragg reflector 708 comprising an n-type semiconductor, a second Bragg reflector 712 comprising a p-type semiconductor, and a quantum well 716 separating the first Bragg reflector 708 and the second Bragg reflector 712. The silicon substrate 704 may comprise complementary metal-oxide semiconductor (CMOS) driving electronics, such that each VCSEL 700 formed on the substrate 704 may be individually driven or activated by an individual CMOS driving circuit, separately from other VCSELs. As each individual VCSEL may comprise a separately-driven optical unit, the VCSEL array may be made more efficient and compact than arrays formed on other substrates or using different driving electronics.

Figure 8:
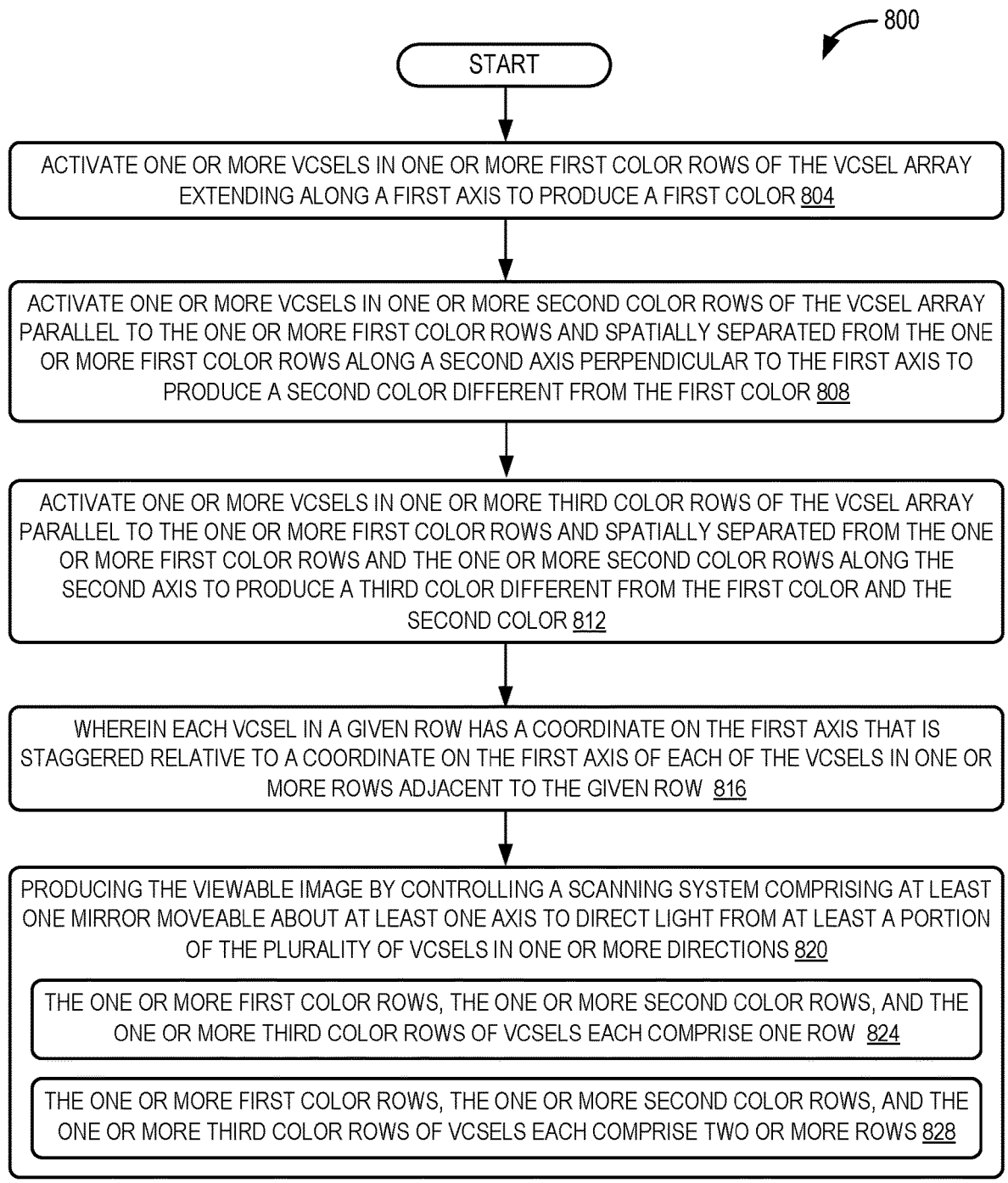
FIG. 8 is a block diagram of a method for producing a viewable image using a plurality of individually-addressable VCSELs arranged into an array according to examples of the present disclosure.

With reference now to FIG. 8, a flow diagram depicting an example method 800 for producing a viewable image using a plurality of individually-addressable VCSELs arranged into an array is provided. The following description of method 800 is provided with reference to the components described herein and shown in FIGS. 1-7 and 9, but it will be appreciated that method 800 also may be performed in other contexts using other suitable components.

At 804, the method 800 includes activating one or more VCSELs in one or more first color rows of the VCSEL array extending along a first axis to produce a first color. At 808, the method 800 includes activating one or more VCSELs in one or more second color rows of the VCSEL array parallel to the one or more first color rows and spatially separated from the one or more first color rows along a second axis perpendicular to the first axis to produce a second color different from the first color. At 812, the method 800 includes activating one or more VCSELs in one or more third color rows of the VCSEL array parallel to the one or more first color rows and spatially separated from the one or more first color rows and the one or more second color rows along the second axis to produce a third color different from the first color and the second color.

At 816, the method 800 includes wherein each VCSEL in a given row has a coordinate on the first axis that is staggered relative to a coordinate on the first axis of each of the VCSELs in one or more rows adjacent to the given row. At 820, the method 800 may also include producing the viewable image by controlling a scanning system comprising at least one mirror moveable about at least one axis to direct light from at least a portion of the plurality of VCSELs in one or more directions. At 824, the method 800 may also include, wherein the one or more first color rows, the one or more second color rows, and the one or more third color rows of VCSELs each comprise one row. At 828 the method 800 may also include, wherein the one or more first color rows, the one or more second color rows, and the one or more third color rows of VCSELs each comprise two or more rows.

In some embodiments, the methods, processes, and devices described herein may be tied to a computing system of one or more computing devices. In particular, such methods and processes may be implemented as a computer-application program or service, an application-programming interface (API), a library, and/or other computer-program product.

Figure 9:
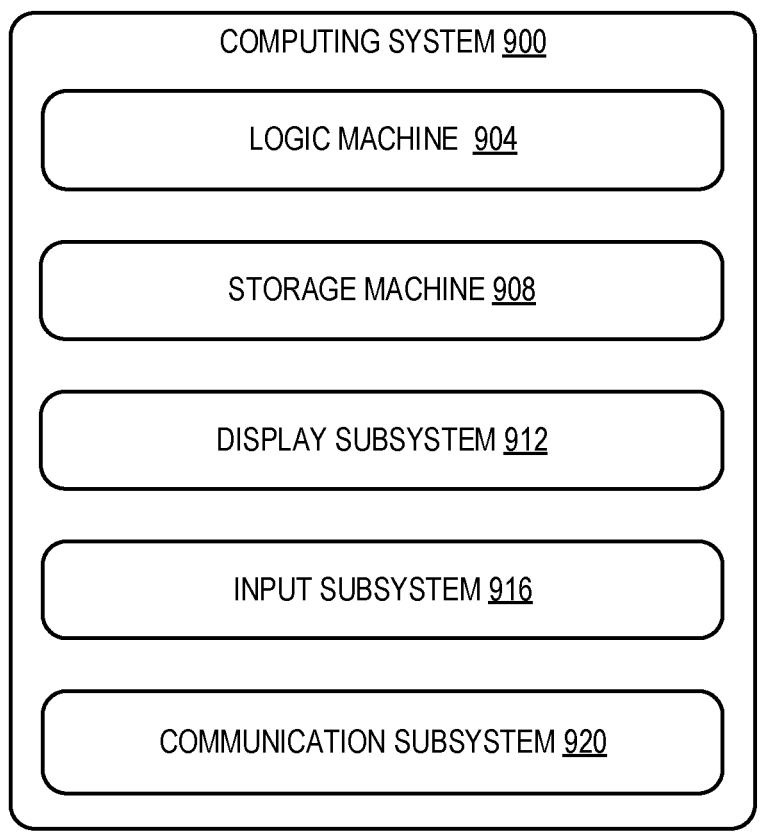
FIG. 9 shows a block diagram of an example computing device according to examples of the present disclosure.

FIG. 9 schematically shows a non-limiting embodiment of a computing system 900 that may be utilized with and/or incorporated into the display devices and scanning mirror systems described above. Computing system 900 is shown in simplified form. In some examples computing system 900 may take the form of one or more virtual reality HMD devices, mixed reality HMD devices, head-up display devices, mobile device screens, monitors, televisions, personal computers, tablet computers, home-entertainment computers, gaming devices, mobile computing devices, mobile communication devices (e.g., smart phone), and/or other computing devices.

Computing system 900 includes a logic machine 904 and a storage machine 908. Computing system 900 may optionally include a display subsystem 912, input subsystem 916, communication subsystem 920, and/or other components not shown in FIG. 9.

Logic machine 904 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors or controllers configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage machine 908 includes one or more physical devices configured to hold instructions executable by the logic machine to implement the methods and processes described herein. When such methods and processes are implemented, the state of storage machine 908 may be transformed—e.g., to hold different data.

Storage machine 908 may include removable and/or built-in devices. Storage machine 908 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 908 may include volatile, nonvolatile, dynamic, static, read/write, read-only, random-access, sequential-access, location-addressable, file-addressable, and/or content-addressable devices.

It will be appreciated that storage machine 908 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 904 and storage machine 908 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 900 implemented to perform a particular function. In some cases, a module, program, or engine may be instantiated via logic machine 904 executing instructions held by storage machine 908. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

It will be appreciated that a "service", as used herein, is an application program executable across multiple user sessions. A service may be available to one or more system components, programs, and/or other services. In some implementations, a service may run on one or more server-computing devices.

When included, display subsystem 912 may be used to present a visual representation of data held by storage machine 908. As the herein described methods and processes change the data held by the storage machine, and thus transform the state of the storage machine, the state of display subsystem 912 may likewise be transformed to visually represent changes in the underlying data. Display subsystem 912 may include one or more display devices utilizing virtually any type of technology. Such display devices may be combined with logic machine 904 and/or storage machine 908 in a shared enclosure, or such display devices may be peripheral display devices.

When included, input subsystem 916 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 920 may be configured to communicatively couple with one or more other computing devices. Communication subsystem 920 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 900 to send and/or receive messages to and/or from other devices via a network such as the Internet.

The following paragraphs provide additional support for the claims of the subject application. One aspect provides a display system comprising: a light source comprising a plurality of individually-addressable vertical cavity surface emitting lasers (VCSELs) arranged into an array comprising, one or more first color rows of VCSELs extending along a first axis and configured to produce a first color, one or more second color rows of VCSELs parallel to the one or more first color rows and spatially separated from the one or more first color rows along a second axis perpendicular to the first axis, the VCSELs in the one or more second color rows configured to produce a second color different from the first color, and one or more third color rows of VCSELs parallel to the one or more first color rows and spatially separated from the one or more first color rows and the one or more second color rows along the second axis, the VCSELs in the one or more third color rows configured to produce a third color different from the first color and the second color, wherein each VCSEL in a given row has a coordinate on the first axis that is staggered relative to a coordinate on the first axis of each of the VCSELs in one or more rows adjacent to the given row; and a scanning system comprising at least one mirror moveable about at least one axis to direct light from at least a portion of the plurality of VCSELs in one or more directions to produce a viewable image.

The display system may additionally or alternatively include, wherein the one or more first color rows, the one or more second color rows, and the one or more third color rows of VCSELs each comprise one row. The display system may additionally or alternatively include, wherein the one or more first color rows, the one or more second color rows, and the one or more third color rows of VCSELs each comprise two or more rows. The display system may additionally or alternatively include, wherein a pitch between the VCSELs in the one or more first color rows, the one or more second color rows, and the one or more third color rows is approximately 4-30 µm.

The display system may additionally or alternatively include, wherein the at least one mirror is moveable about at least one axis parallel to the first axis. The display system may additionally or alternatively include, wherein the at least one mirror is configured to scan the portion of the plurality of VCSELs in a direction parallel to the second axis.

The display system may additionally or alternatively include, wherein the portion of the plurality of VCSELs are individually driven by a complementary metal-oxide-semiconductor (CMOS) driving circuit. The display system may additionally or alternatively include a waveguide configured to receive the light from the scanning system and output the viewable image.

The display system may additionally or alternatively include, wherein the VCSELs are configured to emit light at a wavelength corresponding to a given color, emit light through a phosphor material to produce the given color, or emit light through a filter to produce the given color. The display system may additionally or alternatively include, wherein the first color is red, the second color is green, and the third color is blue.

Another aspect provides a head-mounted display (HMD) device comprising: a light source comprising a plurality of individually-addressable vertical cavity surface emitting lasers (VCSELs) arranged into an array comprising, one or more first color rows of VCSELs extending along a first axis and configured to produce a first color, one or more second color rows of VCSELs parallel to the one or more first color rows and spatially separated from the one or more first color rows along a second axis perpendicular to the first axis, the one or more second color rows configured to produce a second color different from the first color, and one or more third color rows of VCSELs parallel to the one or more first color rows and spatially separated from the one or more first color rows and the one or more second color rows along the second axis, the one or more third color rows configured to produce a third color different from the first color and the second color, wherein each VCSEL in a given row has a coordinate on the first axis that is staggered relative to a coordinate on the first axis of each of the VCSELs in one or more rows adjacent to the given row; a scanning system comprising at least one mirror moveable about at least one axis to direct light from at least a portion of the plurality of VCSELs in one or more directions to produce a viewable image; and a waveguide configured to receive the light from the scanning system and output the viewable image.

The HMD device may additionally or alternatively include, wherein the one or more first color rows, the one or more second color rows, and the one or more third color rows of VCSELs each comprise one row. The HMD device may additionally or alternatively include, wherein the one or more first color rows, the one or more second color rows, and the one or more third color rows of VCSELs each comprise two or more rows.

The HMD device may additionally or alternatively include, wherein a pitch between the VCSELs in the one or more first color rows, the one or more second color rows, and the one or more third color rows is approximately 4-30 µm. The HMD device may additionally or alternatively include, wherein the at least one mirror is moveable about at least one axis parallel to the first axis. The HMD device may additionally or alternatively include, wherein the at least one mirror is configured to scan the portion of the VCSELs in a direction parallel to the second axis. The HMD device may additionally or alternatively include, wherein the plurality of VCSELs are individually driven by a complementary metal-oxide-semiconductor (CMOS) driving circuit.

Another aspect provides a method for producing a viewable image using a plurality of individually-addressable vertical cavity surface emitting lasers (VCSELs) arranged into a VCSEL array, the method comprising: activating one or more VCSELs in one or more first color rows of the VCSEL array extending along a first axis to produce a first color; activating one or more VCSELs in one or more second color rows of the VCSEL array parallel to the one or more first color rows and spatially separated from the one or more first color rows along a second axis perpendicular to the first axis to produce a second color different from the first color; activating one or more VCSELs in one or more third color rows of the VCSEL array parallel to the one or more first color rows and spatially separated from the one or more first color rows and the one or more second color rows along the second axis to produce a third color different from the first color and the second color; wherein each VCSEL in a given row has a coordinate on the first axis that is staggered relative to a coordinate on the first axis of each of the VCSELs in one or more rows adjacent to the given row; and producing the viewable image by controlling a scanning system comprising at least one mirror moveable about at least one axis to direct light from at least a portion of the plurality of VCSELs in one or more directions.

The method may additionally or alternatively include, wherein the one or more first color rows, the one or more second color rows, and the one or more third color rows of VCSELs each comprise one row. The method may additionally or alternatively include, wherein the one or more first color rows, the one or more second color rows, and the one or more third color rows of VCSELs each comprise two or more rows.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:
1. A display system comprising:
  a light source comprising a plurality of individually-addressable vertical cavity surface emitting lasers (VCSELs) arranged into an array comprising,
    one or more first color rows of VCSELs extending along a first axis and configured to produce a first color, one or more second color rows of VCSELs parallel to the one or more first color rows and spatially separated from the one or more first color rows along a second axis perpendicular to the first axis, the VCSELs in the one or more second color rows configured to produce a second color different from the first color, and one or more third color rows of VCSELs parallel to the one or more first color rows and spatially separated from the one or more first color rows and the one or more second color rows along the second axis, the VCSELs in the one or more third color rows configured to produce a third color different from the first color and the second color, wherein each VCSEL in a given row has a coordinate on the first axis that is staggered relative to a coordinate on the first axis of each of the VCSELs in one or more rows adjacent to the given row, such that each VCSEL in the one or more second color rows is spatially separated along the first axis relative to a first axis position of any VCSEL in the one or more first color rows and relative to a first axis position of any VCSEL in the one or more third color rows, and such that each VCSEL in the one or more third color rows is spatially separated along the first axis relative to a first axis position of any VCSEL in the one or more first color rows and relative to a first axis position of any VCSEL in the one or more second color rows; and a scanning system comprising at least one mirror moveable about at least one axis to direct light from at least a portion of the plurality of VCSELs in one or more directions to produce a viewable image.

2. The display system of claim 1, wherein the one or more first color rows, the one or more second color rows, and the one or more third color rows of VCSELs each comprise one row.

3. The display system of claim 1, wherein the one or more first color rows, the one or more second color rows, and the one or more third color rows of VCSELs each comprise two or more rows.

4. The display system of claim 1, wherein a pitch between the VCSELs in the one or more first color rows, the one or more second color rows, and the one or more third color rows is approximately 4-30 µm.

5. The display system of claim 1, wherein the at least one mirror is moveable about at least one axis parallel to the first axis.

6. The display system of claim 1, wherein the at least one mirror is configured to scan the portion of the plurality of VCSELs in a direction parallel to the second axis.

7. The display system of claim 1, wherein the portion of the plurality of VCSELs are individually driven by a complementary metal-oxide-semiconductor (CMOS) driving circuit.

8. The display system of claim 1, further comprising a waveguide configured to receive the light from the scanning system and output the viewable image.

9. The display system of claim 1, wherein the VCSELs are configured to emit light at a wavelength corresponding to a given color, emit light through a phosphor material to produce the given color, or emit light through a filter to produce the given color.

10. The display system of claim 1, wherein the first color is red, the second color is green, and the third color is blue.

11. A head-mounted display (HMD) device comprising:
a light source comprising a plurality of individually-addressable vertical cavity surface emitting lasers (VCSELs) arranged into an array comprising,
one or more first color rows of VCSELs extending along a first axis and configured to produce a first color,
one or more second color rows of VCSELs parallel to the one or more first color rows and spatially separated from the one or more first color rows along a second axis perpendicular to the first axis, the one or more second color rows configured to produce a second color different from the first color, and
one or more third color rows of VCSELs parallel to the one or more first color rows and spatially separated from the one or more first color rows and the one or more second color rows along the second axis, the one or more third color rows configured to produce a third color different from the first color and the second color,
wherein each VCSEL in a given row has a coordinate on the first axis that is staggered relative to a coordinate on the first axis of each of the VCSELs in one or more rows adjacent to the given row, such that each VCSEL in the one or more second color rows is spatially separated along the first axis relative to a first axis position of any VCSEL in the one or more first color rows and relative to a first axis position of any VCSEL in the one or more third color rows, and such that each VCSEL in the one or more third color rows is spatially separated along the first axis relative to a first axis position of any VCSEL in the one or more first color rows and relative to a first axis position of any VCSEL in the one or more second color rows;
a scanning system comprising at least one mirror moveable about at least one axis to direct light from at least a portion of the plurality of VCSELs in one or more directions to produce a viewable image; and
a waveguide configured to receive the light from the scanning system and output the viewable image.

12. The HMD device of claim 11, wherein the one or more first color rows, the one or more second color rows, and the one or more third color rows of VCSELs each comprise one row.

13. The HMD device of claim 11, wherein the one or more first color rows, the one or more second color rows, and the one or more third color rows of VCSELs each comprise two or more rows.

14. The HMD device of claim 11, wherein a pitch between the VCSELs in the one or more first color rows, the one or more second color rows, and the one or more third color rows is approximately 4-30 µm.

15. The HMD device of claim 11, wherein the at least one mirror is moveable about at least one axis parallel to the first axis.

16. The HMD device of claim 11, wherein the at least one mirror is configured to scan the portion of the VCSELs in a direction parallel to the second axis.

17. The HMD device of claim 11, wherein the plurality of VCSELs are individually driven by a complementary metal-oxide-semiconductor (CMOS) driving circuit.

18. A method for producing a viewable image using a plurality of individually-addressable vertical cavity surface emitting lasers (VCSELs) arranged into a VCSEL array, the method comprising:

activating one or more VCSELs in one or more first color rows of the VCSEL array extending along a first axis to produce a first color;

activating one or more VCSELs in one or more second color rows of the VCSEL array parallel to the one or more first color rows and spatially separated from the one or more first color rows along a second axis perpendicular to the first axis to produce a second color different from the first color;

activating one or more VCSELs in one or more third color rows of the VCSEL array parallel to the one or more first color rows and spatially separated from the one or more first color rows and the one or more second color rows along the second axis to produce a third color different from the first color and the second color;

wherein each VCSEL in a given row has a coordinate on the first axis that is staggered relative to a coordinate on the first axis of each of the VCSELs in one or more rows adjacent to the given row, such that each VCSEL in the one or more second color rows is spatially separated along the first axis relative to a first axis position of any VCSEL in the one or more first color rows and relative to a first axis position of any VCSEL in the one or more third color rows, and such that each VCSEL in the one or more third color rows is spatially separated along the first axis relative to a first axis position of any VCSEL in the one or more first color rows and relative to a first axis position of any VCSEL in the one or more second color rows; and producing the viewable image by controlling a scanning system comprising at least one mirror moveable about at least one axis to direct light from at least a portion of the plurality of VCSELs in one or more directions.

19. The method of claim 18, wherein the one or more first color rows, the one or more second color rows, and the one or more third color rows of VCSELs each comprise one row.

20. The method of claim 18, wherein the one or more first color rows, the one or more second color rows, and the one or more third color rows of VCSELs each comprise two or more rows.

* * * * *